(12) United States Patent
Kim

(10) Patent No.: US 8,427,218 B2
(45) Date of Patent: Apr. 23, 2013

(54) DELAY CIRCUIT AND METHOD FOR DRIVING THE SAME

(75) Inventor: Tae-Kyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 198 days.

(21) Appl. No.: 12/832,470

(22) Filed: Jul. 8, 2010

(65) Prior Publication Data

US 2011/0291727 A1  Dec. 1, 2011

(30) Foreign Application Priority Data

May 28, 2010 (KR) .................. 10-2010-0050438

(51) Int. Cl.
  *H03K 3/00* (2006.01)
(52) U.S. Cl.
  USPC ........................................ 327/291; 327/172
(58) Field of Classification Search .................. 327/261, 327/263, 264, 269, 270, 272, 172
  See application file for complete search history.

(56) References Cited

U.S. PATENT DOCUMENTS

| | | | | |
|---|---|---|---|---|
| 5,969,555 A * | 10/1999 | Suda | ............... | 327/172 |
| 6,476,657 B2 * | 11/2002 | Kuhne | ........... | 327/291 |
| 7,154,316 B2 * | 12/2006 | Park | ............... | 327/172 |
| 7,205,814 B2 * | 4/2007 | Park | ............... | 327/291 |
| 7,319,355 B2 * | 1/2008 | Wu et al. | ......... | 327/291 |
| 7,605,628 B2 * | 10/2009 | Magee et al. | ......... | 327/261 |
| 7,719,332 B2 * | 5/2010 | Heragu et al. | ......... | 327/158 |
| 7,791,392 B2 * | 9/2010 | Oh | ............... | 327/291 |

FOREIGN PATENT DOCUMENTS

| KR | 1020040074105 | 8/2004 |
|---|---|---|
| KR | 1020060009578 | 2/2006 |
| KR | 100592648 | 6/2006 |
| KR | 1020100055238 | 5/2010 |

\* cited by examiner

*Primary Examiner* — Hai L Nguyen
(74) *Attorney, Agent, or Firm* — IP & T Group LLP

(57) ABSTRACT

A delay circuit includes a pulse generation unit configured to generate a pulse signal, which is activated in response to an input signal and has a pulse width corresponding to delay information, and an output unit configured to activate a final output signal in response to a deactivation of the pulse signal.

22 Claims, 5 Drawing Sheets

DELAY CIRCUIT AND METHOD FOR DRIVING THE SAME

CROSS-REFERENCE TO RELATED APPLICATIONS

The present application claims priority of Korean Patent Application No. 10-2010-0050438, filed on May 28, 2010, which is incorporated herein by reference in its entirety.

BACKGROUND OF THE INVENTION

Exemplary embodiments of the present invention relate to a delay circuit for delaying an input signal and a method for driving the same.

A delay circuit refers to a circuit which delays an input signal in order to match signal timing. In particular, a variable delay circuit refers to a circuit which delays an input signal according to a set value. Since a variety of semiconductor devices must be operated based on their inherent operation orders and in synchronization with a variety of operation timings, variable delay circuits are widely applied to semiconductor devices.

FIG. 1 is a block diagram of a conventional delay circuit for delaying an input signal according to a set delay value.

Referring to FIG. 1, the conventional delay circuit includes a plurality of shift units 101 to 104 coupled in series, and a selection unit 120 configured to select one of a plurality of output signals FF1 to FFi of the shift units 101 to 104. Here, the 'i' in FFi represents a variable integer.

The shift units 101 to 104 coupled in series delay their input signals by 1 clock, and the selection unit 120 selects one of the output signals FF1 to FF1 of the shift units 101 to 104, and outputs the selected output signal as a final output signal OUT of the delay circuit. Therefore, the delay value of the delay circuit changes according to the output signal of the shift unit selected by the selection unit 120.

The selection unit 120 selects one of the output signals of the shift units 101 to 104 according to delay information I-SEL<1:i> inputted thereto. That is, the delay information I-SEL<1:i> is information which determines the delay value of the delay circuit.

Accordingly, the conventional delay circuit may delay the input signal by various delay values. However, the operation of the delay circuit may be unstable when the input signal is activated at a relatively high frequency.

SUMMARY OF THE INVENTION

Exemplary embodiments of the present invention are directed to a delay circuit and a method for driving the same, capable of ensuring a stable operation even though an input signal is activated at a relatively high frequency.

In accordance with an exemplary embodiment of the present invention, a delay circuit includes a pulse generation unit configured to generate a pulse signal, which is activated in response to an input signal and has a pulse width corresponding to delay information, and an output unit configured to activate a final output signal in response to a deactivation of the pulse signal.

Further, the pulse generation unit may include a synchronization section configured to synchronize the input signal with a clock, at least one shift section configured to sequentially shift the input signal an output signal of the synchronization section, which is in synchronization with a clock, a selection section configured to select one output signal of the at least one shift section in response to delay information, and an SR latch configured to activate the pulse signal in response to the output signal of the synchronization section and deactivate the pulse signal in response to an output signal of the selection section.

In accordance with another exemplary embodiment of the present invention, a delay circuit includes a first input unit configured to receive an input signal, a first delay unit configured to output a first output signal by performing a delay operation to delay the input signal transferred from the first input unit by a first value corresponding to delay information, a second input unit configured to receive the input signal, a second delay unit configured to output a second output signal by performing a delay operation to delay the input signal transferred from the second input unit by a second value corresponding to the delay information, and a final output unit configured to activate a final output signal when the first output signal or the second output signal is activated, wherein the first input unit transfers the input signal when the first delay unit is not performing the delay operation, and the second input unit transfers the input signal when the first delay unit is performing the delay operation.

In accordance with yet another exemplary embodiment of the present invention, a method for driving a delay circuit comprising first and second delay units, which receive an input signal and perform a delay operation, includes outputting a first output signal of the first delay unit by delaying the input signal by a first value corresponding to delay information, outputting a second output signal of the second delay unit by delaying the input signal by a second value corresponding to the delay information when the first delay unit is performing the delay operation, and activating a final output signal when the first output signal of the first delay unit or the second output signal of the second delay unit is activated.

DESCRIPTION OF SPECIFIC EMBODIMENTS

Figure 1:
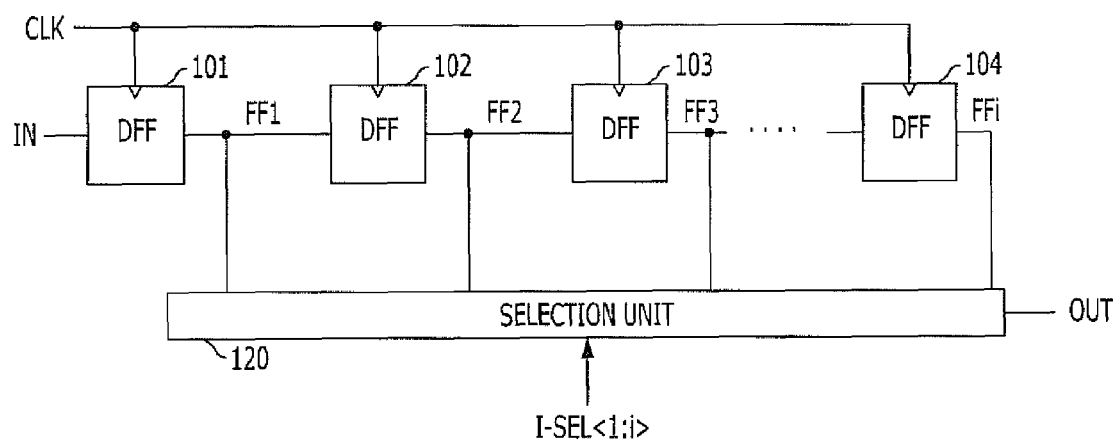
FIG. 1 is a block diagram of a conventional delay circuit for delaying an input signal according to a set delay value.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
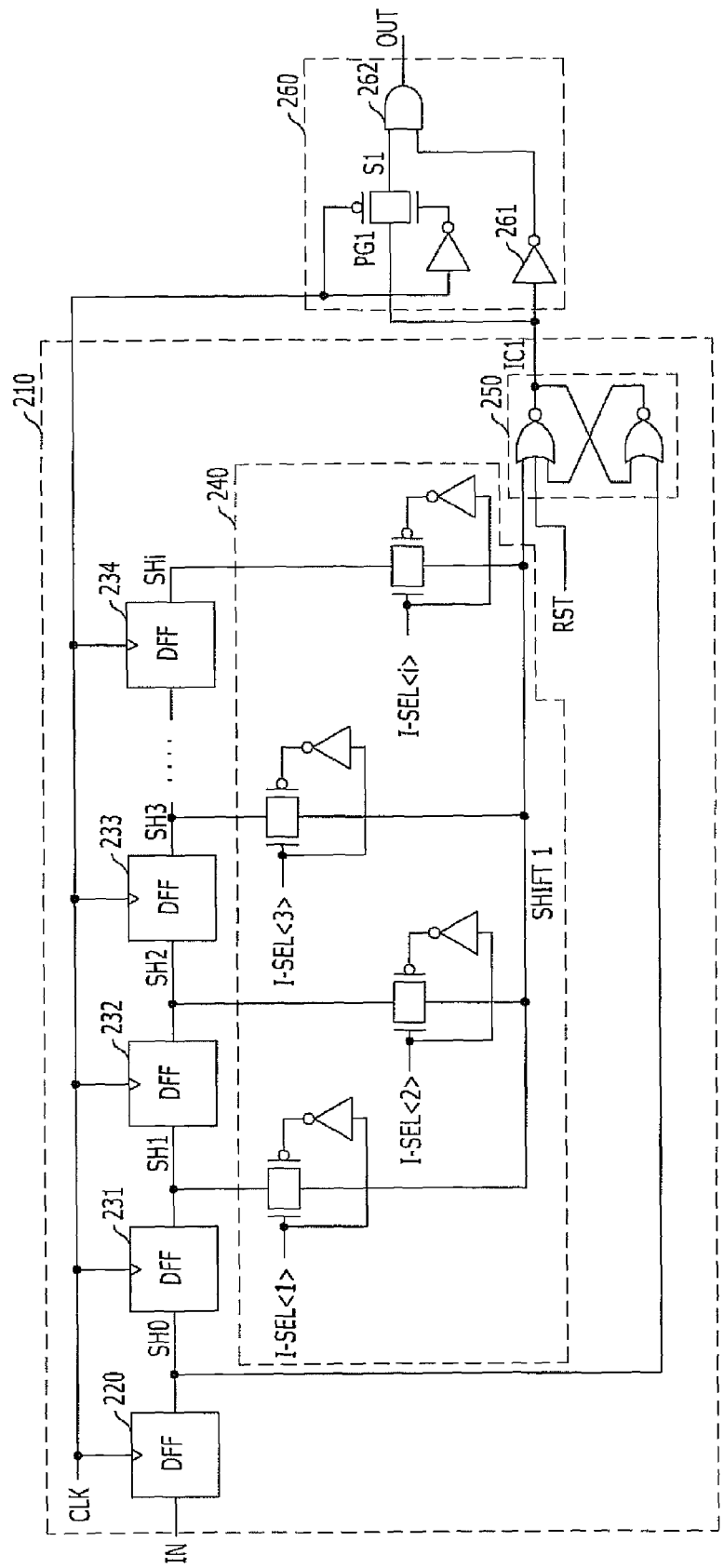
FIG. 2 is a block diagram of a delay circuit in accordance with an exemplary embodiment of the present invention.

FIG. 2 is a block diagram of a delay circuit in accordance with an exemplary embodiment of the present invention.

Referring to FIG. 2, the delay circuit in accordance with an exemplary embodiment of the present invention includes a pulse generation unit 210 and an output unit 260. The pulse generation unit 210 is configured to generate a pulse signal IC1, which is activated in response to an input signal IN and has a pulse width corresponding to delay information I-SEL<1:i>. Here, the 'i' represents a variable integer. The output unit 260 is configured to activate an output signal OUT in response to a deactivation of the pulse signal IC1.

The pulse generation unit 210 includes a synchronization section 220, a plurality of shift sections 231 to 234, a selection section 240, and an SR latch 250. The synchronization section 220 is configured to synchronize the input signal IN with a clock CLK. The plurality of shift sections 231 to 234 are configured to sequentially shift an output signal SH0 of the synchronization section 220, which is in synchronization with the clock CLK. The selection section 240 is configured to select one of a plurality of output signals SH1 to SHi of the plurality of shift sections 231 to 234 in response to the delay information I-SEL<1:i>. The SR latch 250 is configured to activate the pulse signal IC1 in response to the output signal SH0 of the synchronization section 220, and deactivate the pulse signal IC1 in response to an output signal SHIFT1 of the selection section 240.

When the input signal IN is activated and inputted to the pulse generation unit 210, the synchronization section 220 synchronizes the input signal IN with the clock CLK. The activated output signal SH0 of the synchronization section 220 is inputted to the SR latch 250, and the pulse signal IC1 is activated. Meanwhile, the output signal SH0 of the synchronization section 220 is sequentially shifted by the plurality of shift sections 231 to 234. The selection section 240 selects one of the output signals SH1 to SHi of the shift sections 231 to 234. The output signal SHIFT1 of the selection section 240 is inputted to the SR latch 250 and deactivates the pulse signal IC1. Therefore, the pulse width of the pulse signal IC1 generated from the SR latch 250 is equal to the timing difference between the input signal SH0 synchronized by the synchronization section 220 and the output signal of the shift section selected by the selection section 240 (i.e., the output signal SHIFT1 of the selection section). Since the selection operation of the selection section 240 is performed based on the delay information I-SEL<1:i>, the delay information I-SEL<1:i> determines the pulse width of the pulse signal IC1 generated by the pulse generation unit 210. For example, when the signal I-SEL<3> of the signals constituting the delay information I-SEL<1:i> is activated, the pulse width of the pulse signal IC1 becomes equivalent to 3 periods of the clock CLK. Similarly, for example, when the signal I-SEL<5> is activated, the pulse width of the pulse signal IC1 becomes equivalent to 5 periods of the clock CLK.

For reference, a reset signal RST inputted to the RS latch 250 is a signal which maintains a logic high level before the operation of the delay circuit and maintains a logic low level after the delay circuit starts to operate.

The output unit 260 includes a pass gate PG1, an inverter 261, and an AND gate 262. The pass gate PG1 is configured to transfer the pulse signal IC1 in response to the clock CLK. The inverter 261 is configured to invert the pulse signal IC1. The AND gate 262 is configured to receive an output signal S1 of the pass gate PG1 and an output signal of the inverter 261. Further, the AND gate 262 is configured to perform an AND operation onto the received signals and output the output signal OUT. The output unit 260 configured as above activates the output signal OUT at the moment that the pulse signal IC1 changes from a logic high level to a logic low level.

Figure 3:
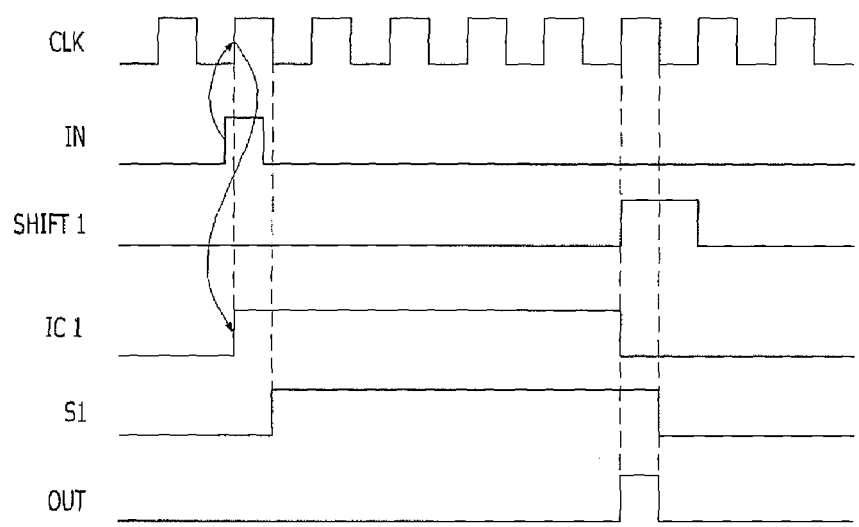
FIG. 3 is a timing diagram illustrating an operation of the delay circuit of FIG. 2.

FIG. 3 is a timing diagram illustrating an operation of the delay circuit of FIG. 2.

Specifically, FIG. 3 shows a case in which the signal I-SEL<5> of the signals constituting the delay information I-SEL<1:i> is activated. Thus, the delay circuit delays the input signal IN by 5 periods of the clock CLK.

Referring to FIG. 3, when the input signal IN is activated, the pulse signal IC1 is activated in synchronization with a rising edge of the clock CLK. The output signal SHIFT1 of the selection section 240 is activated when 5 periods of the clock CLK elapse from the activation of the pulse signal IC1. When the output signal SHIFT1 of the selection section 240 is activated, the pulse signal IC1 is deactivated. The output signal OUT is activated at a timing when the pulse signal IC1 changes from a logic high level to a logic low level. Consequently, as shown in FIG. 3, the output signal is activated when 5 periods of the clock CLK elapse from the activation of the input signal IN.

Figure 4:
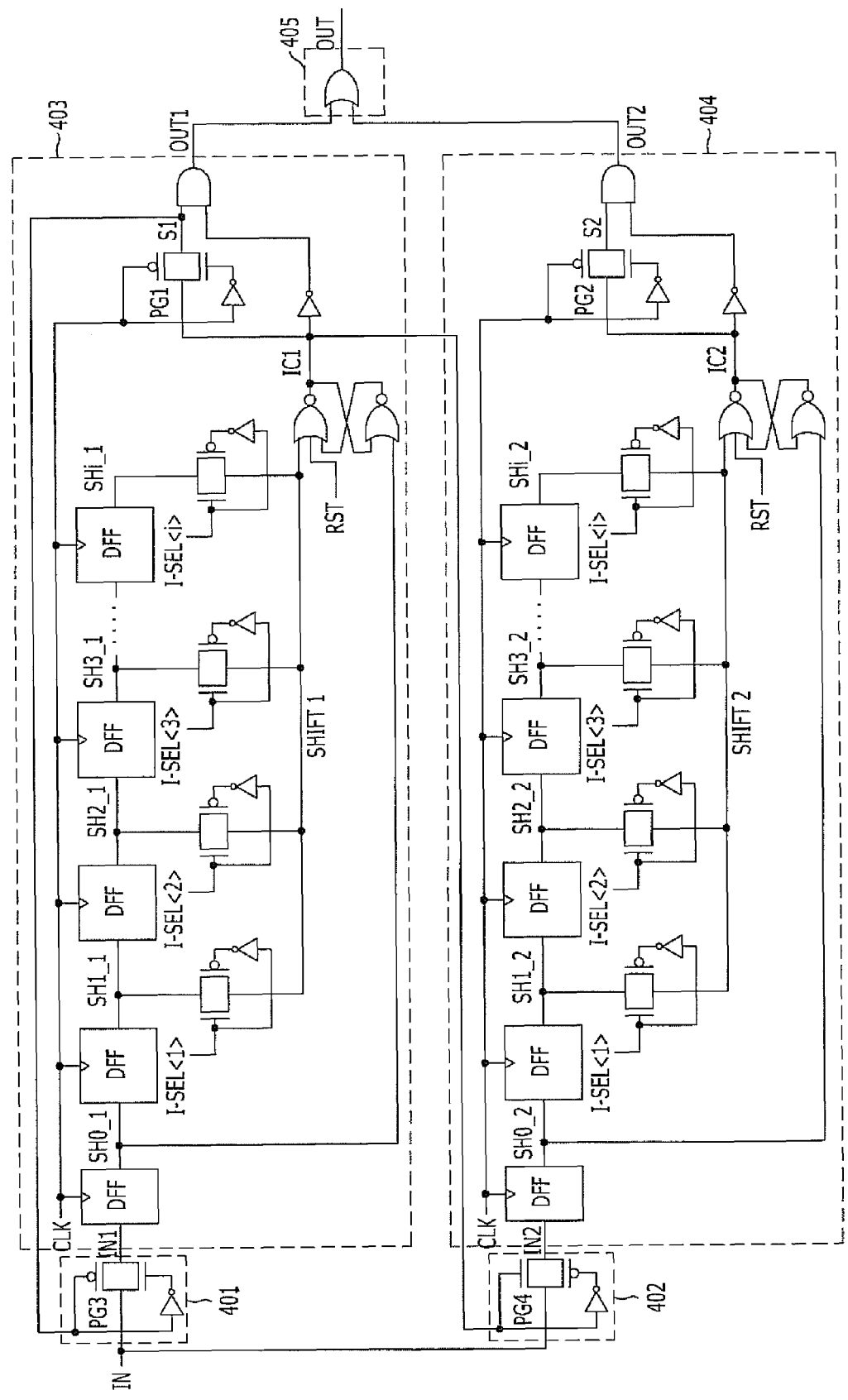
FIG. 4 is a block diagram of a delay circuit in accordance with another exemplary embodiment of the present invention.

FIG. 4 is a block diagram of a delay circuit in accordance with another exemplary embodiment of the present invention.

Specifically, FIG. 4 illustrates an exemplary embodiment which includes two delay circuits of FIG. 2 (hereinafter, referred to as delay units). Referring to FIG. 4, the delay circuit in accordance with another exemplary embodiment of the present invention includes a first input unit 401, a first delay unit 403, a second input unit 402, a second delay unit 404, and a final output unit 405.

The first input unit 401 is configured to receive an input signal IN. The first delay unit 403 is configured to output a first output signal OUT1 by delaying the input signal IN1 transferred from the first input unit 401 by a value corresponding to delay information I-SEL<1:i>. The second input unit 402 is configured to receive the input signal IN. The second delay unit 404 is configured to output a second output signal OUT2 by delaying the input signal IN2 transferred from the second input unit 402 by a value corresponding to the delay information I-SEL<1:i>. The final output unit 405 is configured to activate a final output signal OUT when the first output signal OUT1 or the second output signal OUT2 is activated. Here, the first input unit 401 receives the input signal IN only when the first delay unit 403 does not perform the delay operation, and the second input unit 402 receives the input signal IN only when the first delay unit 403 performs the delay operation.

In case where the first delay unit 403 does not perform the delay operation, the first input unit 401 inputs the input signal IN to the first delay unit 403. However, in case where the first delay unit 403 performs the delay operation, the first input unit 401 does not input the input signal IN to the first delay unit 403. For this, the first input unit 401 may be implemented with a pass gate PG3, which is turned on/off in response to the output signal S1 of the pass gate PG1. Here, for example, the pass gate PG3 is turned on when the signal S1 is at a logic low level, and is turned off when the signal S1 is at a logic high level. When the signal IN1 inputted to the first delay unit 403 is activated, the output signal 51 of the pass gate PG1 changes to a logic high level. When the output signal OUT1 of the first delay unit 403 is activated, the output signal S1 of the pass gate PG1 changes to a logic low level. Therefore, the pass gate PG3 is turned on and receives the input signal IN only during the period in which the first delay unit 403 does not perform the delay operation.

In case where the first delay unit 403 performs the delay operation, the second input unit 402 inputs the input signal IN to the second delay unit 404. However, in case where the first delay unit 403 does not perform the delay operation, the second input unit 402 does not input the input signal IN to the second delay unit 404. For this, the second input unit 404 may be implemented with a pass gate PG4, which is turned on/off in response to the pulse signal IC1 outputted from the first delay unit 403. Here, for example, the pass gate PG4 is turned on when the pulse signal IC1 outputted from the first delay unit 403 is at a logic high level, and is turned off when the pulse signal IC1 outputted from the first delay unit 403 is at a logic low level. When the signal IN1 inputted to the first delay unit 403 is activated, the pulse signal IC1 outputted from the first delay unit 403 is activated. When the output signal OUT1 of the first delay unit 403 is activated, the pulse signal IC1 outputted from the first delay unit 403 is deactivated. Thus, the activation of the pulse signal IC1 outputted from the first delay unit 403 means that the first delay unit 403 is performing the delay operation. Therefore, the pass gate PG4 is turned on and receives the input signal IN only during the period in which the first delay unit 403 performs the delay operation.

The final output unit 405 is configured to activate the final output signal OUT when the output signal OUT1 of the first delay unit 403 or the output signal OUT2 of the second delay unit 404 is activated. As shown in FIG. 4, the final output unit 405 may be implemented with an OR gate.

Since the first delay unit 403 and the second delay unit 404 have substantially the same configuration as that of the delay circuit of FIG. 2 and perform the operation of delaying the input signals IN1 and IN2 in the same manner as the delay circuit of FIG. 2, an additional detailed description thereof will be omitted.

However, the overall operation of the delay circuit of FIG. 4 is described below.

When the input signal IN of the delay circuit is activated a first time, the first delay unit 403 delays the input signal IN. When the input signal IN is activated at a second time after the first time, either the first delay unit 403 or the second delay unit 404 delays the input signal IN, which is activated at the second time. More specifically, when the first delay unit 403 completes the operation of delaying the input signal IN, which is activated at the first time, before the second time, the first delay unit 403 delays the input signal IN, which is activated at the second time. However, when the input signal IN, which is activated at the first time, is still being delayed by the first delay unit 403 at the second time, the second delay unit 404 delays the input signal IN, which is activated at the second time.

That is, in this embodiment, when the first delay unit 403 and the second delay unit 404 do not complete their delay operations, they do not receive the signal IN to be delayed. Thus, only one delay operation is performed in each of the first and second delay units 403 and 404 at any time. Consequently, the delay circuit may stably operate.

Although the delay circuit including two delay units is illustrated in FIG. 4, a larger number of delay units may be provided within the delay circuit in order to ensure the stable operation of the delay circuit.

Figure 5:
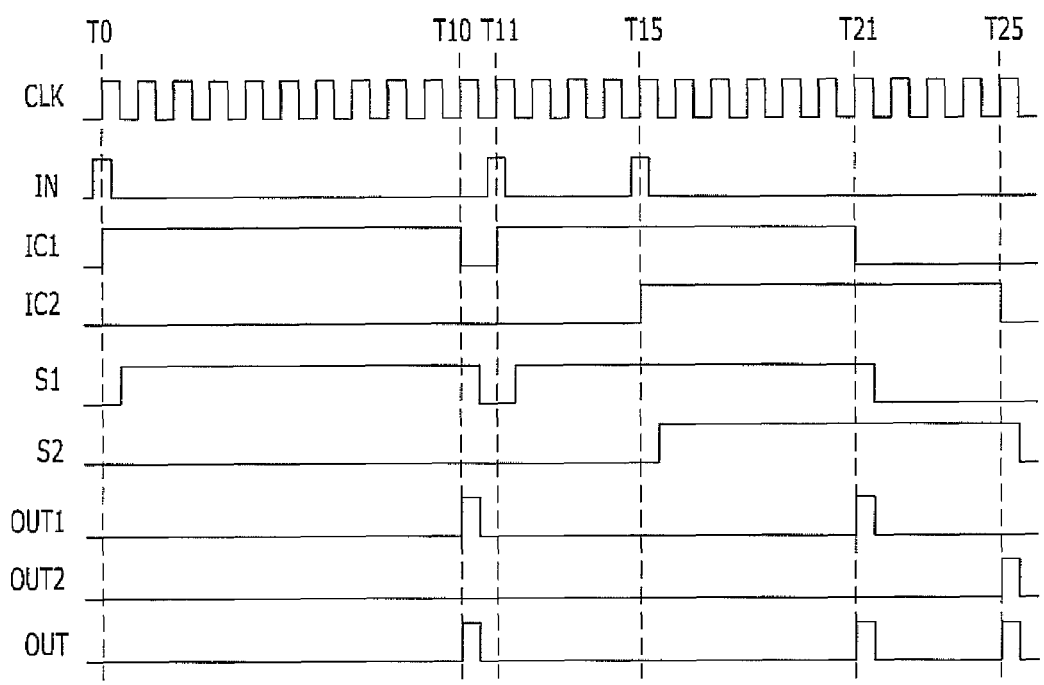
FIG. 5 is a timing diagram illustrating an operation of the delay circuit of FIG. 4.

FIG. 5 is a timing diagram illustrating an operation of the delay circuit of FIG. 4.

It is assumed that the signal I-SEL<10> of the delay information I-SEL<1:i> is activated, that is, the delay value is set to 10 periods of the clock CLK.

First, the input signal IN is activated at a first time T0, and the first input unit 401 receives the activated input signal IN and transfers the received input signal IN to the first delay unit 403. The output signal OUT1 of the first delay unit 403 is activated at time T10 as a result of the delay operation of the first delay unit 403. Consequently, the final output signal OUT is activated.

The input signal IN is activated at a second time T11. Since the first delay unit 403 does not perform the delay operation at time T11, the first input unit 401 receives the activated input signal IN at the second time T11, and transfers the received input signal IN to the first delay unit 403. The output signal OUT1 of the first delay unit 403 is activated at time T21 by the delay operation of the first delay unit 403. Consequently, the final output signal OUT is activated at time T21 as well.

The input signal IN is activated at a third time at time 115. At time T15, the first delay unit 403 is still performing the operation of delaying the input signal IN activated at time T11. Thus, the second input unit 402 receives the input signal IN activated at time T15, and transfers the received input signal IN to the second delay unit 404. The output signal OUT2 of the second delay unit 404 is activated at time T25 by the delay operation of the second delay unit 404. Consequently, the final output signal OUT is activated at time T25 as well.

Referring to the timing diagram of FIG. 5, it can be seen that only one delay operation is performed in each of the first and second delay units 403 404 at any time. Consequently, the stable delay operation of the delay circuit may be achieved.

In accordance with exemplary embodiments of the present invention, when the input signal is activated, a delay unit delays the input signal. However, when the input signal is again activated while the delay operation of said delay unit is being performed, the input signal is delayed by another delay unit. Therefore, the stable operation of the delay circuit may be ensured even though the input signal is activated at a relatively high frequency.

While the present invention has been described with respect to the specific embodiments, it will be apparent to those skilled in the art that various changes and modifications may be made without departing from the spirit and scope of the invention as defined in the following claims.

What is claimed is:

1. A delay circuit comprising:
   a pulse generation unit configured to generate a pulse signal which is activated in response to an input signal and in synchronization with a clock and has a pulse width corresponding to delay information; and
   an output unit configured to activate a final output signal in response to a deactivation of the pulse signal,
   wherein the pulse generation unit comprises:
      a synchronization section configured to synchronize the input signal with a clock;
      at least one shift section configured to sequentially shift an output signal of the synchronization section, which is in synchronization with the clock;
      a selection section configured to select one output signal of the at least one shift section in response to delay information; and
      an SR latch configured to activate the pulse signal in response to the output signal of the synchronization section and deactivate the pulse signal in response to an output signal of the selection section.

2. The delay circuit of claim 1, wherein the output unit is configured to output the final output signal by performing a logic operation on the clock and the pulse signal.

3. The delay circuit of claim 1, wherein the output unit comprises:
   a pass gate configured to transfer the pulse signal in response to the clock;
   an inverter configured to invert the pulse signal; and
   a logic gate configured to perform an AND operation on an output signal of the pass gate and an output signal of the inverter and output the final output signal.

4. A delay circuit comprising:
   a first input unit configured to receive an input signal;
   a first delay unit configured to output a first output signal by performing a delay operation to delay the input signal transferred from the first input unit by a first value corresponding to delay information;

a second input unit configured to receive the input signal;
a second delay unit configured to output a second output signal by performing a delay operation to delay the input signal transferred from the second input unit by a second value corresponding to the delay information; and
a final output unit configured to activate a final output signal when the first output signal or the second output signal is activated,
wherein the first input unit transfers the input signal when the first delay unit is not performing the delay operation, and the second input unit transfers the input signal when the first delay unit is performing the delay operation.

5. The delay circuit of claim 4, wherein the first delay unit comprises:
a first pulse generation unit configured to generate a first pulse signal which is activated in response to the input signal transferred from the first input unit and has a pulse width corresponding to the delay information; and
a first output unit configured to activate the first output signal in response to a deactivation of the first pulse signal.

6. The delay circuit of claim 5, wherein the second input unit is configured to determine whether to transfer the input signal in response to the first pulse signal.

7. The delay circuit of claim 5, wherein the first pulse generation unit comprises:
a first synchronization section configured to synchronize the input signal transferred from the first delay unit with a clock;
at least one first shift section configured to sequentially shift an output signal of the first synchronization section, which is in synchronization with the clock;
a first selection section configured to select one output signal of the at least one first shift section in response to the delay information; and
a first SR latch configured to activate the first pulse signal in response to the output signal of the first synchronization section and deactivate the first pulse signal in response to an output signal of the first selection section.

8. The delay circuit of claim 7, wherein the first output unit is configured to output the first output signal by performing a logic operation on the clock and the first pulse signal.

9. The delay circuit of claim 7, wherein the first output unit comprises:
a first pass gate configured to transfer the first pulse signal in response to the clock;
a first inverter configured to invert the first pulse signal; and
a first logic gate configured to perform an AND operation on an output signal of the first pass gate and an output signal of the first inverter and output the first output signal.

10. The delay circuit of claim 9, wherein the first input unit is configured to determine whether to transfer the input signal in response to the output signal of the first pass gate.

11. The delay circuit of claim 4, wherein the second delay unit comprises:
a second pulse generation unit configured to generate a second pulse signal which is activated in response to the input signal transferred from the second input unit and has a pulse width corresponding to the delay information; and
a second output unit configured to activate the second output signal in response to a deactivation of the second pulse signal.

12. The delay circuit of claim 11, wherein the second pulse generation unit comprises:

a second synchronization section configured to synchronize the input signal transferred from the second delay unit with a clock;
at least one second shift section configured to sequentially shift an output signal of the second synchronization section, which is in synchronization with the clock;
a second selection section configured to select one output signal of the at least one second shift section in response to the delay information; and
a second SR latch configured to activate the second pulse signal in response to the output signal of the second synchronization section and deactivate the second pulse signal in response to an output signal of the second selection section.

13. The delay circuit of claim 12, wherein the second output unit is configured to output the second output signal by performing a logic operation on the clock and the second pulse signal.

14. The delay circuit of claim 12, wherein the second output unit comprises:
a second pass gate configured to transfer the second pulse signal in response to the clock;
a second inverter configured to invert the second pulse signal; and
a second logic gate configured to perform an AND operation on an output signal of the second pass gate and an output signal of the second inverter and output the second output signal.

15. The delay circuit of claim 4, wherein the first value is not equal to the second value.

16. The delay circuit of claim 4, wherein the first value is equal to the second value.

17. A method for driving a delay circuit comprising first and second delay units, which receive an input signal and perform a delay operation, the method comprising:
outputting a first output signal of the first delay unit by delaying the input signal by a first value corresponding to delay information;
outputting a second output signal of the second delay unit by delaying the input signal by a second value corresponding to the delay information when the first delay unit is performing the delay operation; and
activating a final output signal when the first output signal of the first delay unit or the second output signal of the second delay unit is activated,
wherein the outputting of the first output signal of the first delay unit comprises:
generating a first pulse signal, which is activated in response to the input signal and has a pulse width corresponding to the delay information; and
activating the first output signal in response to a deactivation of the first pulse signal,
wherein the generating of the first pulse signal comprises:
outputting a synchronization signal by synchronizing the input signal with a clock;
sequentially shifting the synchronization signal, which is in synchronization with the clock;
outputting a selection signal by selecting a shifted signal in response to the delay information; and
activating the first pulse signal in response to the synchronization signal and deactivating the first pulse signal in response to the selection signal.

18. The method of claim 17, further comprising determining whether to transfer the input signal to the second delay unit in response to the first pulse signal.

19. The method of claim 17, wherein the outputting of the second output signal of the second delay unit comprises:
  generating a second pulse signal, which is activated in response to the input signal and has a pulse width corresponding to the delay information; and
  activating the second output signal in response to a deactivation of the second pulse signal.

20. The method of claim 19, wherein the generating of the second pulse signal comprises:
  outputting a synchronization signal by synchronizing the input signal with a clock;
  sequentially shifting the synchronization signal, which is in synchronization with the clock;
  outputting a selection signal by selecting a shifted signal in response to the delay information; and
  activating the second pulse signal in response to the synchronization signal and deactivating the second pulse signal in response to the selection signal.

21. The method of claim 17, wherein the first value is equal to the second value.

22. The method of claim 17, wherein the first value is not equal to the second value.

* * * * *